(12) United States Patent
Kim et al.

(10) Patent No.: US 8,946,748 B2
(45) Date of Patent: Feb. 3, 2015

(54) SEMICONDUCTOR LIGHT EMITTING DEVICE INCLUDING REAR REFLECTIVE PART

(75) Inventors: Tae Hun Kim, Gyeonggi-do (KR);
Seung Wan Chae, Gyeonggi-do (KR);
Yong Il Kim, Gyeonggi-do (KR); Seung Jae Lee, Chungcheongnam-do (KR);
Tae Sung Jang, Gyeonggi-do (KR);
Jong Rak Sohn, Gyeonggi-do (KR); Bo Kyoung Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/478,849

(22) Filed: May 23, 2012

(65) Prior Publication Data

US 2012/0299040 A1 Nov. 29, 2012

(30) Foreign Application Priority Data

May 23, 2011 (KR) .................. 10-2011-0048368

(51) Int. Cl.
*H01L 33/00* (2010.01)
*H01L 27/15* (2006.01)
*H01L 33/46* (2010.01)
*H01L 33/20* (2010.01)

(52) U.S. Cl.
CPC .............. *H01L 33/46* (2013.01); *H01L 33/20* (2013.01)
USPC ................... 257/98; 257/99; 257/82; 257/88; 257/E21.002; 257/E51.018

(58) Field of Classification Search
CPC ......... H01L 33/60; H01L 33/62; H01L 33/20; H01L 33/486; H01L 31/167; H01L 25/0753
USPC .................. 257/98–99, 40, 82, 88, E21.002, 257/E51.018, E51.019
See application file for complete search history.

(56) References Cited

U.S. PATENT DOCUMENTS

| 2002/0093023 A1 | 7/2002 | Camras et al. |
| 2005/0230699 A1 | 10/2005 | Wu et al. |
| 2005/0279990 A1 | 12/2005 | Liu et al. |
| 2006/0244883 A1* | 11/2006 | Okumura ............... 349/114 |
| 2007/0069222 A1 | 3/2007 | Ko et al. |

(Continued)

FOREIGN PATENT DOCUMENTS

| EP | 2 264 792 A2 | 12/2010 |
| JP | 2010-186873 | 8/2010 |

(Continued)

OTHER PUBLICATIONS

Extended European Search Report issued in European Patent Application No. EP 12169106.7 dated Sep. 21, 2012.

*Primary Examiner* — A. Sefer
*Assistant Examiner* — Dilinh Nguyen
(74) *Attorney, Agent, or Firm* — McDermott Will & Emery LLP

(57) ABSTRACT

There is provided a semiconductor light emitting device including: a light transmissive substrate; a light emitting part; first and second electrodes electrically connected to the first and second conductivity type semiconductor layers, respectively; and a rear reflective part including a reflective metallic layer, and a light transmissive dielectric layer interposed between the light transmissive substrate and the reflective metallic layer.

11 Claims, 9 Drawing Sheets

(56) References Cited

U.S. PATENT DOCUMENTS

2010/0123153 A1* 5/2010 Lin et al. .................. 257/98
2010/0140636 A1* 6/2010 Donofrio et al. ............ 257/98
2011/0031502 A1  2/2011 Bergmann et al.

FOREIGN PATENT DOCUMENTS

| KR | 10-2006-0016177 A | 2/2006 |
| KR | 10-2008-0017180 A | 2/2008 |

* cited by examiner

SEMICONDUCTOR LIGHT EMITTING DEVICE INCLUDING REAR REFLECTIVE PART

CROSS-REFERENCE TO RELATED APPLICATIONS

This application claims the priority of Korean Patent Application No. 10-2011-0048368 filed on May 23, 2011, in the Korean Intellectual Property Office, the disclosure of which is incorporated herein by reference.

BACKGROUND OF THE INVENTION

1. Field of the Invention

The present invention relates to a semiconductor light emitting device and a method of manufacturing the same.

2. Description of the Related Art

A light emitting diode (LED) is a semiconductor device able to emit light of various colors due to electron-hole recombination occurring at a p-n junction between p-type and n-type semiconductors when current is applied thereto. Such an LED is advantageous over a filament-based light emitting device in that it has a long lifespan, low power consumption, superior initial-operation characteristics, and the like. These factors have continually boosted the demand for LEDs. Notably of late, a great deal of attention has been drawn to group III nitride semiconductors that can emit light in a blue/short wavelength region.

Since the development of nitride semiconductor devices, technical advances to broaden the range of applications thereof have been made. Thus, many studies are being conducted into determining how to utilize nitride semiconductor devices in general lighting apparatuses and electrical lighting sources. According to the related art, nitride light emitting devices have been used as components employed in low-current, low output mobile products. However, of late, the range of applications of nitride light emitting devices has been broadened to encompass the field of high-current, high-output products.

Meanwhile, a semiconductor layer constituting the LED has a high refractive index as compared with external air, an encapsulated material, or a substrate, reducing a critical angle determining an incident angle range in which light can be emitted. As a result, a considerable amount of light generated from an active layer is totally internally reflected to be emitted in a substantially undesired direction or be lost in a total internal reflection process, whereby light extraction efficiency may be reduced. Accordingly, a method of increasing an amount of light emitted in a desired direction and improving substantial luminance is required.

SUMMARY OF THE INVENTION

An aspect of the present invention provides a semiconductor light emitting device including a reflector structure on a rear surface of a growth substrate, the reflector structure having superior light reflectance and heat dissipation characteristics.

An aspect of the present invention also provides a method of manufacturing the above semiconductor light emitting device in an efficient manner.

According to an aspect of the present invention, there is provided a semiconductor light emitting device including: a light transmissive substrate having first and second main surfaces facing each other, the second main surface having an uneven portion formed thereon; a light emitting part disposed on the first main surface, and including first and second conductivity type semiconductor layers and an active layer interposed therebetween; first and second electrodes electrically connected to the first and second conductivity type semiconductor layers, respectively; and a rear reflective part including a reflective metallic layer disposed on the second main surface, and a light transmissive dielectric layer interposed between the light transmissive substrate and the reflective metallic layer.

The light transmissive dielectric layer may include a plurality of dielectric layers having different refractive indexes and alternately stacked. Here, the plurality of dielectric layers may have a distributed Bragg reflector (DBR) structure.

The light transmissive dielectric layer and the reflective metallic layer may have an omni-directional reflector (ODR) structure.

The light transmissive substrate may include an uneven portion formed on the first main surface thereof.

The reflective metallic layer may be formed of a material selected from the group consisting of aluminum (Al), silver (Ag), nickel (Ni), rhodium (Rh), palladium (Pd), iridium (Ir), ruthenium (Ru), magnesium (Mg), zinc (Zn), platinum (Pt), and gold (Au).

The semiconductor light emitting device may further include a planarization layer filling an uneven surface of the reflective metallic layer when surfaces of the light transmissive dielectric layer and the reflective metallic layer are unevenly formed due to conforming to curves of the uneven portion formed on the light transmissive substrate.

The planarization layer may be formed of spin on glass (SOG).

The light transmissive dielectric layer may be formed of a material having a thermal conductivity higher than that of the light transmissive substrate.

According to another aspect of the present invention, there is provided a light emitting apparatus including: a mounting substrate; a semiconductor light emitting device mounted on the mounting substrate and emitting light when an electrical signal is applied thereto; and an adhesive layer interposed between the mounting substrate and the semiconductor light emitting device, wherein the semiconductor light emitting device includes: a light transmissive substrate having first and second main surfaces facing each other, the second main surface having an uneven portion formed thereon; a light emitting part disposed on the first main surface, and including first and second conductivity type semiconductor layers and an active layer interposed therebetween; first and second electrodes electrically connected to the first and second conductivity type semiconductor layers, respectively; and a rear reflective part including a reflective metallic layer disposed on the second main surface, and a light transmissive dielectric layer interposed between the light transmissive substrate and the reflective metallic layer.

The mounting substrate may be a circuit board. Alternatively, the mounting substrate may be a lead frame.

The adhesive layer may be formed of at least one of a eutectic alloy and a polymer.

According to another aspect of the present invention, there is provided a method of manufacturing a semiconductor light emitting device, the method including: preparing a light transmissive substrate having first and second main surfaces facing each other, and forming a light emitting part on the first main surface, the light emitting part including first and second conductivity type semiconductor layers and an active layer interposed therebetween; forming first and second electrodes electrically connected to the first and second conductivity type semiconductor layers, respectively; forming an uneven portion on the second main surface of the light transmissive substrate; and forming a rear reflective part including a reflective metallic layer disposed on the second main surface of the light transmissive substrate provided with the uneven portion, and a light transmissive dielectric layer interposed between the light transmissive substrate and the reflective metallic layer.

The method may further include forming a temporary substrate on the top of the light emitting part in order to support the light emitting part before the forming of the uneven portion on the second main surface of the light transmissive substrate.

The method may further include separating the temporary substrate from the light emitting part after the forming of the rear reflective part.

The light transmissive dielectric layer may include a plurality of dielectric layers having different refractive indexes and alternately stacked.

The plurality of dielectric layers may have a distributed Bragg reflector (DBR) structure.

The light transmissive dielectric layer and the reflective metallic layer may have an omni-directional reflector (ODR) structure.

The method may further include forming an uneven portion on the first main surface of the light transmissive substrate before the forming of the light emitting part.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
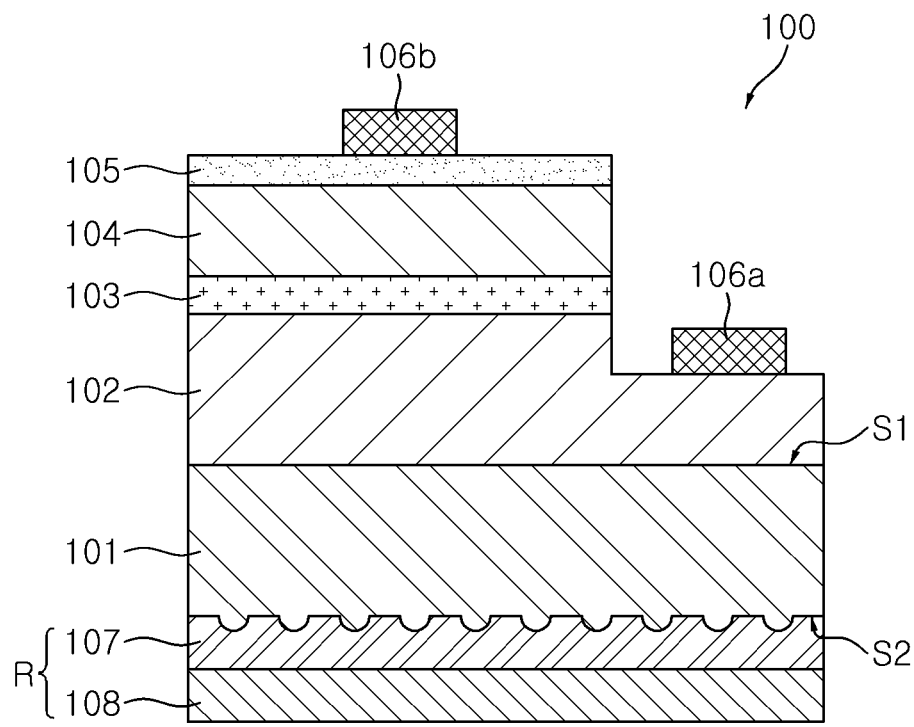
FIG. 1 is a schematic cross-sectional view illustrating a semiconductor light emitting device according to an embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Figure 2:
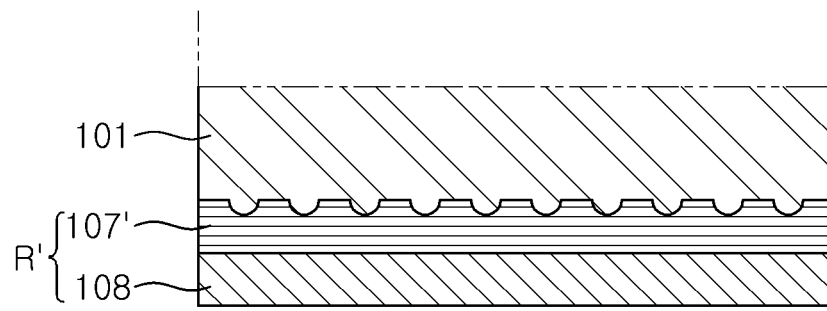
FIGS. 2 and 3 are schematic cross-sectional views illustrating the structure of a rear reflective part according to a modification of the embodiment of FIG. 1.
Figure 3:
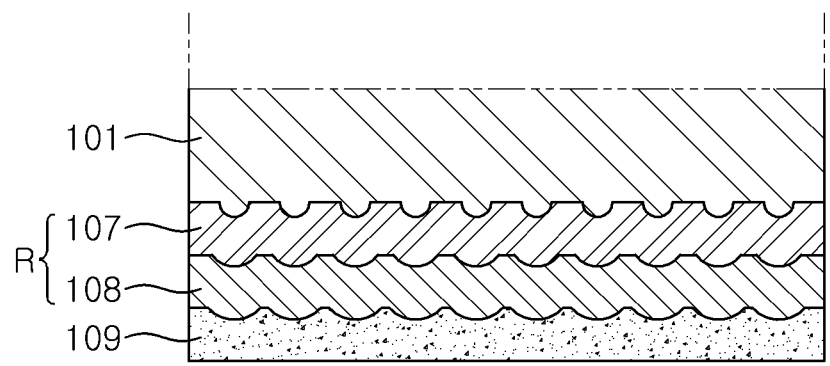

FIG. 1 is a schematic cross-sectional view illustrating a semiconductor light emitting device according to an embodiment of the invention. FIGS. 2 and 3 are schematic cross-sectional views illustrating the structure of a rear reflective part according to a modification of the embodiment of FIG. 1. With reference to FIG. 1, a semiconductor light emitting device 100 according to this embodiment of the invention includes a light transmissive substrate 101 having first and second main surfaces S1 and S2 facing each other, and a light emitting part formed on the top of the first main surface S1 of the light transmissive substrate 101, the light emitting part including a first conductivity type semiconductor layer 102, an active layer 103, a second conductivity type semiconductor layer 104 and an ohmic electrode layer 105 stacked sequentially. Further, first and second electrodes 106a and 106b are formed on upper surfaces of the first conductivity type semiconductor layer 102 and the ohmic electrode layer 105.

A rear reflective part R is formed on the bottom of the second main surface S2 of the light transmissive substrate 101 such that light emitted from the active layer 103 and passing through the light transmissive substrate 101 may be introduced upwardly. The rear reflective part R includes a light transmissive dielectric layer 107 and a reflective metallic layer 108. In this case, as shown in FIG. 1, the light transmissive dielectric layer 107 is interposed between the light transmissive substrate 101 and the reflective metallic layer 108. Here, the terms 'top,' 'bottom,' 'upper surface,' 'lower surface,' 'lateral surface' and the like are based on the directionality of the drawings, which may be changed according to a direction in which the semiconductor light emitting device is actually mounted.

The light transmissive substrate 101 may be provided as a semiconductor growth substrate, and may utilize a substrate formed of a semiconductor material having insulation or conductivity properties, such as sapphire, SiC, $MgAl_2O_4$, MgO, $LiAlO_2$, $LiGaO_2$, GaN or the like. The light transmissive substrate 101 may allow at least a portion of light emitted from the active layer 103 to be transmitted therethrough. In this case, sapphire having electrical insulation properties may most preferably be used. Sapphire is a crystal having Hexa-Rhombo R3C symmetry and has a lattice constant of 13.001 Å along a C-axis and a lattice constant of 4.758 Å along an A-axis. Orientation planes of the sapphire include a C (0001) plane, an A (1120) plane, an R (1102) plane, and the like. Particularly, the C plane is mainly used as a substrate for nitride growth because it relatively facilitates the growth of a nitride film and is stable at high temperatures.

The first and second conductivity type semiconductor layers 102 and 104 may be semiconductor layers doped with n-type and p-type impurities, respectively; however, the invention is not limited thereto. On the contrary, the first and second conductivity type semiconductor layers 102 and 104 may be p-type and n-type semiconductor layers, respectively. The first and second conductivity type semiconductor layers 102 and 104 may be formed of a nitride semiconductor. For example, a material having a compositional formula of $Al_xIn_yGa_{1-x-y}N$ ($0 \leq x \leq 1$, $0 \leq y \leq 1$, $0 \leq x+y \leq 1$) may be used therefor. Besides, an AlGaInP semiconductor or an AlGaAs semiconductor may also be used. The active layer 103, disposed between the first and second conductivity type semiconductor layers 102 and 104, emits light having a predetermined level of energy through electron-hole recombination. The active layer 103 may have a multi-quantum well (MQW) structure in which quantum well and quantum barrier layers are alternately stacked, and here, in the case of the nitride semiconductor, a GaN/InGaN structure may be used. Meanwhile, the first and second conductivity type semiconductor layers 102 and 104 and the active layer 103 forming a light emitting structure may be grown by a semiconductor-layer growth process known in the art, such as Metal Organic Chemical Vapor Deposition (MOCVD), Hydride Vapor Phase Epitaxy (HVPE), Molecular Beam Epitaxy (MBE), or the like.

The ohmic-electrode layer 105 may be formed of a material that exhibits electrical ohmic-characteristics with the second conductivity type semiconductor layer 104. For example, the ohmic-electrode layer 105 may be formed of a transparent conductive oxide, such as ITO, CIO, ZnO, or the like, that has a high level of light transmittance and relatively excellent ohmic-contact performance, among materials for a transparent electrode. Here, the ohmic-electrode layer 105 may not be essential in the present embodiment and may be excluded according to varying circumstances.

The first and second electrodes 106a and 106b may be formed of a material having electrical conductivity known in the art. For example, the first and second electrodes 106a and 106b may be formed by depositing, sputtering, or the like, one or more of silver (Ag), aluminum (Al), nickel (Ni), chromium (Cr), and the like. In the structure illustrated in FIG. 1, the first and second electrodes 106a and 106b are formed on the upper surfaces of the first conductivity type semiconductor layer 102 and the ohmic-electrode layer 105, respectively, but such an electrode formation scheme is merely an example, and electrodes may be formed in various positions on the light emitting structure including the first conductivity type semiconductor layer 102, the active layer 103, and the second conductivity type semiconductor layer 104.

In the present embodiment, the rear reflective part R including the light transmissive dielectric layer 107 and the reflective metallic layer 108 may be formed on the second main surface S2 of the light transmissive substrate 101, thereby changing a path of light directed toward the light transmissive substrate 101 in a desired direction (in which the light emitting part is disposed). The light transmissive dielectric layer 107 may be formed of an oxide or a nitride including an element selected from the group consisting of silicon (Si), zirconium (Zr), tantalum (Ta), titanium (Ti), indium (In), tin (Sn), magnesium (Mg), and aluminum (Al), as a material having a certain refractive index. The reflective metallic layer 108 may be formed of a material including aluminum (Al), silver (Ag), nickel (Ni), rhodium (Rh), palladium (Pd), iridium (Ir), ruthenium (Ru), magnesium (Mg), zinc (Zn), platinum (Pt), gold (Au), or the like, such as an alloy containing aluminum (Al) or silver (Ag), in order to have a high reflective performance. The reflective metallic layer 108 may be combined with the light transmissive dielectric layer 107 such that reflectivity may be further improved. For example, in a case in which the light transmissive dielectric layer 107 having a thickness satisfying $\lambda/4n$ of a wavelength of light emitted from the active layer 103 and formed of a material having a low refractive index, such as $SiO_2$, and the reflective metallic layer 108 formed of a material having high reflectance, such as aluminum (Al), silver (Ag), or the like, are stacked on the second main surface S2, an omni-directional reflector (ODR) structure may be implemented.

Also, an uneven portion is formed on the second main surface S2 of the light transmissive substrate 101, such that it may increase a contact area between the light transmissive dielectric layer 107 and the light transmissive substrate 101. In a case in which the light transmissive dielectric layer 107 has relatively high thermal conductivity as compared with the light transmissive substrate 101 (for example, in a case in which the light transmissive substrate 101 is formed of sapphire and the light transmissive dielectric layer 107 is formed of $SiO_2$), dissipation of heat generated in the light emitting part may be improved. In an optical aspect, a reflective area is increased by the uneven portion of the second main surface S2, such that reflectivity of the rear reflective part R may be improved. Furthermore, a path of light reflected by the rear reflective part R may be varied to thereby increase an orientation angle of light emitted from the semiconductor light emitting device 100. The uneven portion of the second main surface S2 may be variously shaped, so long as it can increase an interfacial area between the light transmissive substrate 101 and the light transmissive dielectric layer 107. In a case in which the uneven portion has a hemispherical structure as shown in FIG. 1, a triangular pyramid structure, or the like that are protruded outwardly of the second main surface S2, light reflective efficiency may be further enhanced.

Figure 4:
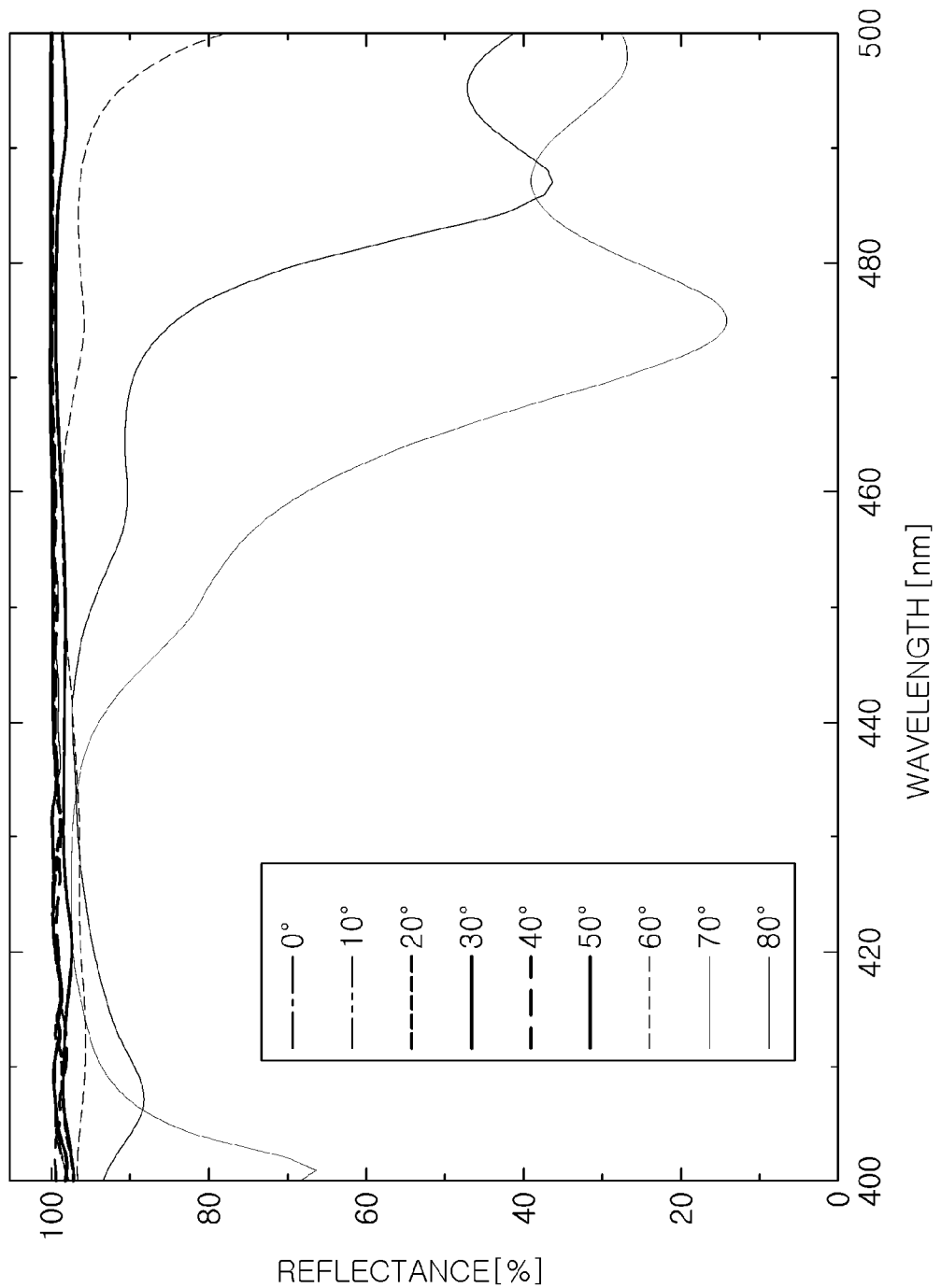
FIG. 4 is a graph illustrating a change in reflectance over an incident angle of a distributed Bragg reflector (DBR) structure itself.
Figure 5:
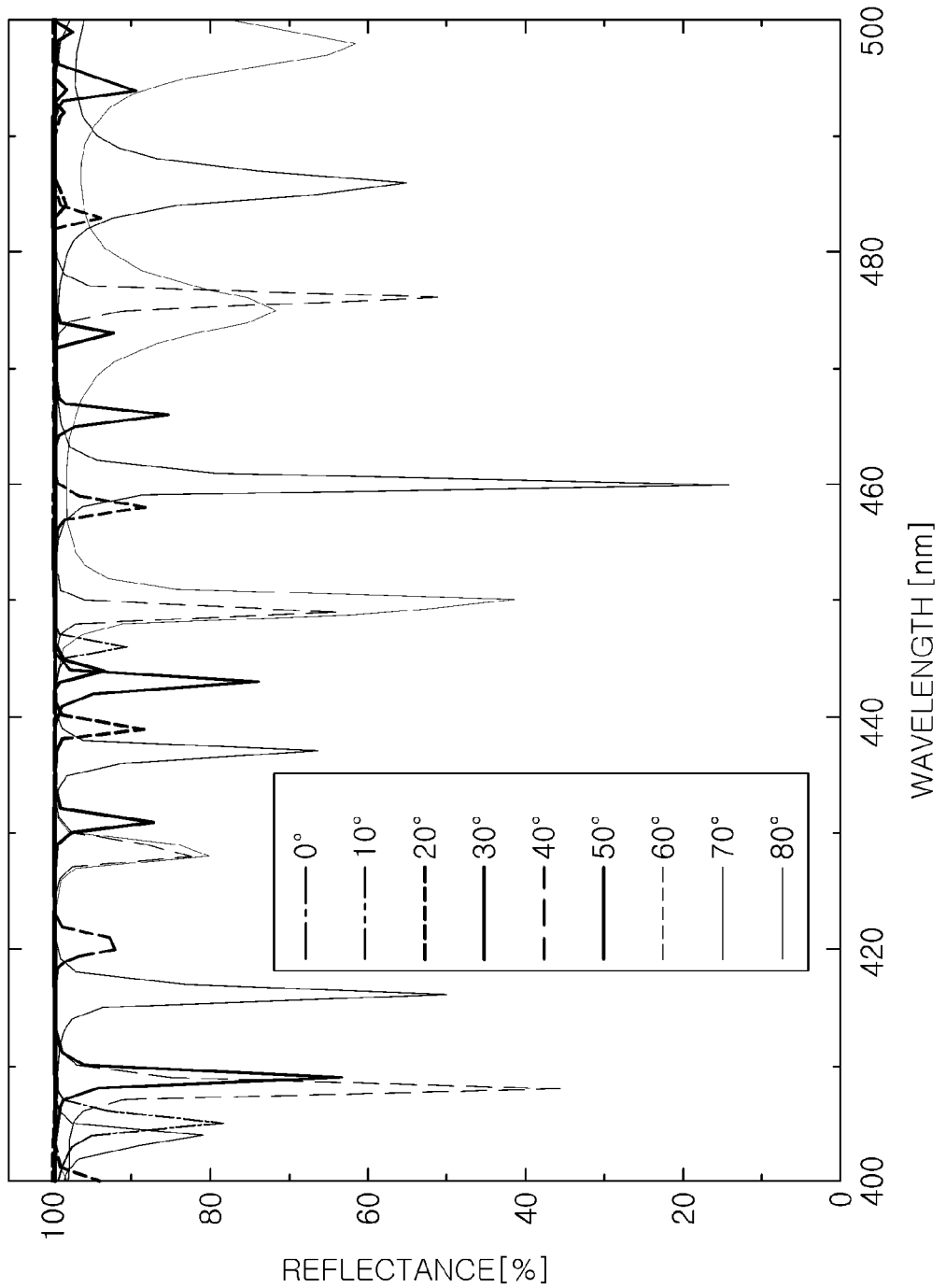
FIG. 5 is a graph illustrating a change in reflectance over an incident angle of a DBR+reflective metallic layer structure, applicable to an embodiment of the present invention.

Meanwhile, as a modification of the above structure, a light transmissive dielectric layer 107' may have a distributed Bragg reflector (DBR) structure in which a plurality of dielectric layers having different refractive indexes are alternately stacked, as shown in FIG. 2. The light transmissive dielectric layer 107' having the DBR structure has a high reflective index of 90% or more. In a case in which the light transmissive dielectric layer 107' is combined with the reflective metallic layer 108 to thereby form an ODR structure, reflectivity may be further improved. This will be described with reference to FIGS. 4 and 5. FIG. 4 is a graph illustrating a change in reflectance over an incident angle of a DBR structure itself; and FIG. 5 is a graph illustrating a change in reflectance over an incident angle of a DBR+reflective metallic layer structure, applicable to an embodiment of the present invention. Here, the uneven portion formed on the second main surface of the substrate has been omitted from the respective structures.

With reference to FIGS. 4 and 5, when the incident angle was small (about 50° or smaller), there was not much difference between the DBR structure and the DBR+reflective metallic layer structure. On the other hand, in the case in which the incident angle was large, when only the DBR structure was used, its reflectance was greatly changed according to wavelength bands. Namely, when the wavelength was 440 nm or larger, the reflectance of the DBR structure tended to be considerably lowered as shown in FIG. 4, but the DBR+reflective metallic layer structure (in this experiment, an Al reflective film was used) as shown in FIG. 5 was maintained to have high overall reflectance, without excessive changes according to the incident angle. In this manner, it was confirmed that, as compared with the case of using the DBR structure alone, when the reflective metallic layer was additionally combined with the DBR structure, the change in reflectance according to the wavelength bands and incident angles was reduced, to obtain excellent reflective characteristics.

Meanwhile, in a modified structure shown in FIG. 3, in a case in which the surfaces of the light transmissive dielectric layer 107 and the reflective metallic layer 108 conform to curves of the uneven portion formed on the light transmissive substrate 101 such that they may not be evenly formed, a void or the like may be formed in a contact area when the semiconductor light emitting device 100 is mounted on a mounting substrate, whereby adhesive force therebetween may be reduced. In order to overcome this problem, a planarization layer 109 may be formed to fill uneven portions of the surface of the reflective metallic layer 108. The planarization layer 109 may be formed by applying liquid glass, a polymer or the like to the surface of the reflective metallic layer 108 and hardening the applied substance. In consideration of excellent adhesion to the mounting substrate, spin on glass (SOG) may be used. The SOG may allow for planarization in a viscous liquid state. The planarization layer 109 may be formed by rotating a region to which the SOG is to be applied at a rapid pace and applying a liquid material in an even manner through centrifugal force.

Figure 6:
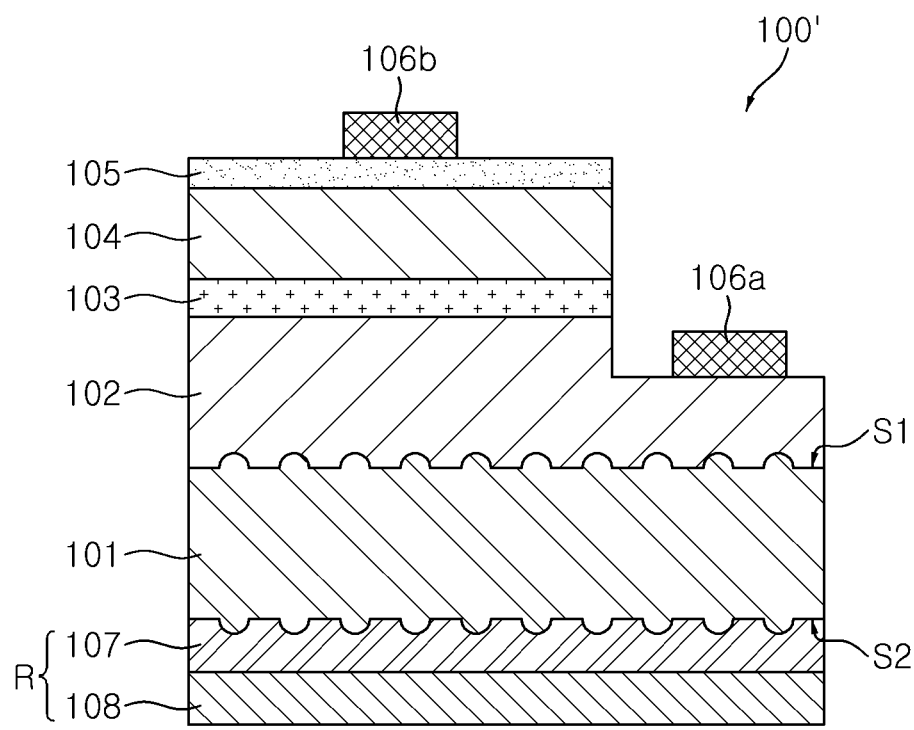
FIG. 6 is a schematic cross-sectional view illustrating a semiconductor light emitting device according to a modification of the embodiment of FIG. 1.

FIG. 6 is a schematic cross-sectional view illustrating a semiconductor light emitting device according to a modification of the embodiment of FIG. 1. With reference to FIG. 6, a semiconductor light emitting device 100' according to this embodiment of the invention includes a light transmissive substrate 101 having first and second main surfaces S1 and S2 facing each other, a first conductivity type semiconductor layer 102, an active layer 103, a second conductivity type semiconductor layer 104, an ohmic electrode layer 105, and first and second electrodes 106a and 106b. Further, a rear reflective part R is formed on the second main surface S2 of the light transmissive substrate 101, the second main surface S2 having an uneven portion formed thereon, and includes a light transmissive dielectric layer 107 and a reflective metallic layer 108. Unlike the previous embodiment, an uneven portion is further formed on the first main surface S1 of the light transmissive substrate 101. The uneven portion of the first main surface S1 induces the growth of a semiconductor layer formed on the light transmissive substrate 101. In this embodiment, the uneven portion of the first main surface S1 induces the lateral growth of the first conductivity type semiconductor layer 102, whereby crystallinity may be improved. In an optical aspect, a total reflection ratio is reduced in an interface between the first conductivity type semiconductor layer 102 and the light transmissive substrate 101, whereby the loss of light may be reduced. In this case, the uneven portion of the first main surface S1 may have the same shape as that of the second main surface S2, or may have a different shape therefrom. The shape of the uneven portion may be hemispheric, triangular-pyramidic, or the like.

Figure 7:
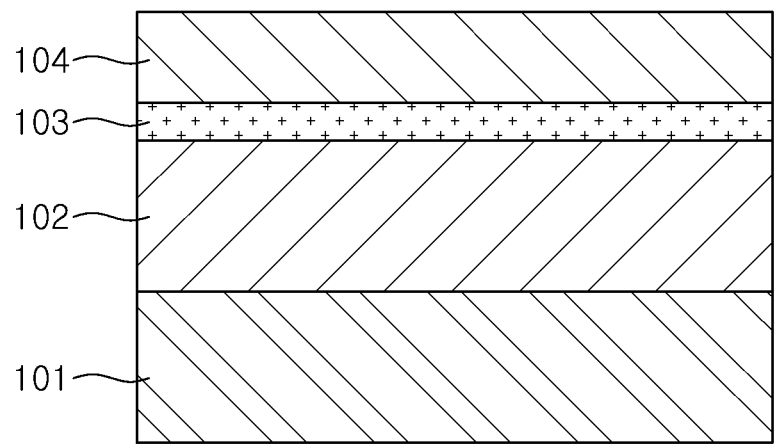
FIGS. 7 through 11 are schematic cross-sectional views illustrating a method of manufacturing a semiconductor light emitting device according to an embodiment of the present invention.
Figure 8:
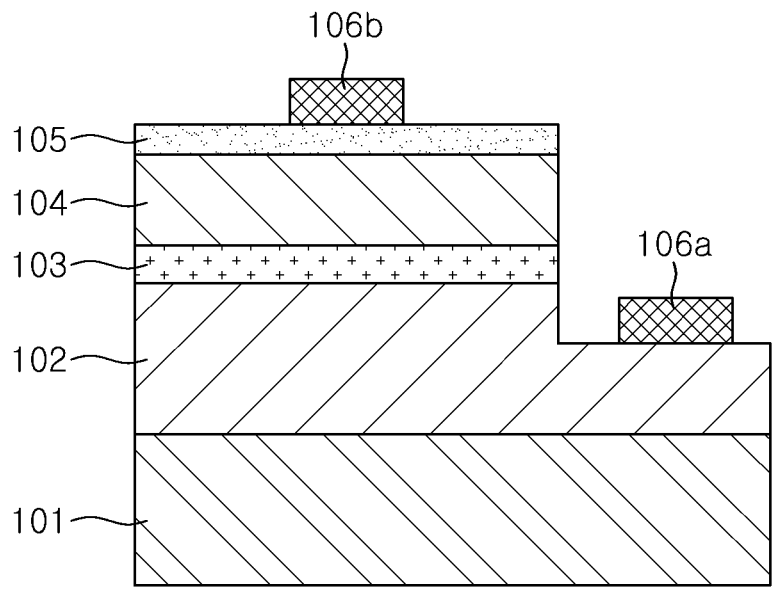

Hereinafter, a method of manufacturing the semiconductor light emitting device having such a structure as described above will be described with reference to FIGS. 7 through 11. The manufacturing method will be described with regard to the semiconductor light emitting device of FIG. 1 as a reference example; however, it would be obvious to those skilled in the art that the manufacturing method may be used to manufacture a semiconductor light emitting device having a different structure according to another embodiment of the invention. In the method of manufacturing the semiconductor light emitting device according to the present embodiment, as shown in FIG. 7, the light emitting part may first be formed by growing the first conductivity type semiconductor layer 102, the active layer 103 and the second conductivity type semiconductor layer 104 on the light transmissive substrate 101 by MOCVD, HVPE, or the like. Next, as shown in FIG. 8, the ohmic electrode layer 105 may be formed on the second conductivity type semiconductor layer 104 using a deposition process, a sputtering process, or the like. Then, the first and second electrodes 106a and 106b may be formed to be connected to the first and second conductivity type semiconductor layers 102 and 104, respectively. Here, in order to form the first electrode 106a, a portion of the light emitting part may be removed to thereby expose the first conductivity type semiconductor layer 102.

Figure 9:
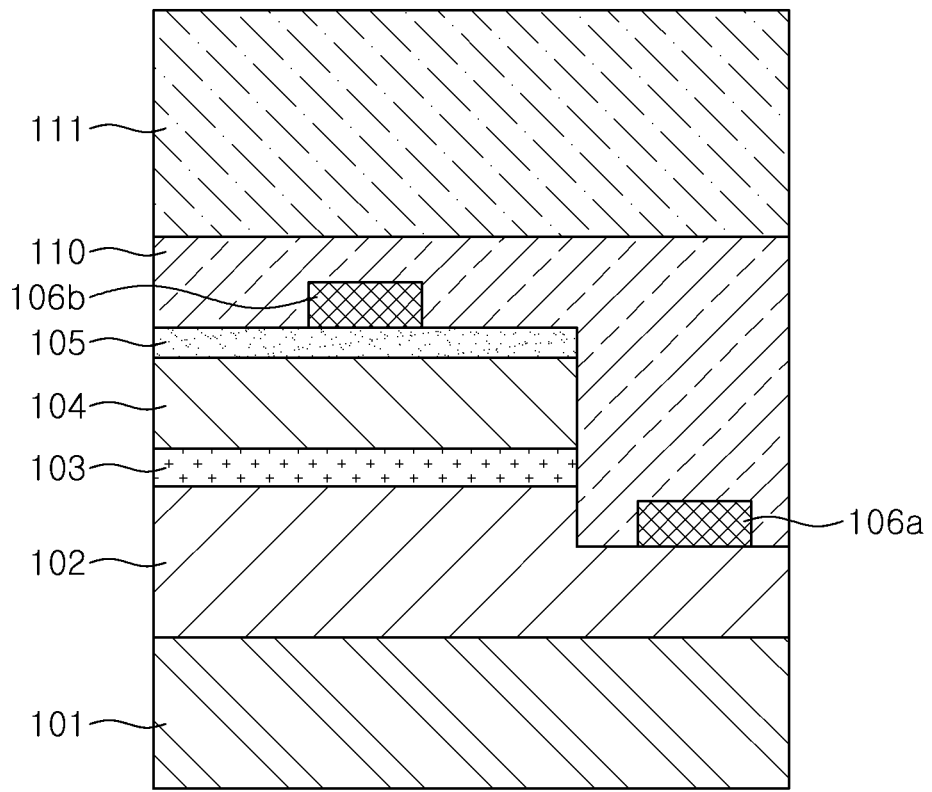

Thereafter, as shown in FIG. 9, a temporary substrate 111 may be supportedly formed on the top of the light emitting part. Further, an adhesive part 110, formed of SOG or a polymer having adhesive force, such as glue or the like, may be interposed in order to adhere the temporary substrate 111 to the light emitting part. However, the adhesive part 110 may not be essential in this embodiment. The temporary substrate 111 may be provided as any structure so long as it can support the light emitting part. The temporary substrate 111 may be formed of a material having a thermal expansion coefficient similar to that of a semiconductor material forming the light emitting part, such as Si, SiC, GaN, or the like. In the case in which the adhesive part 110 is formed of the SOG, it may be subjected to rotational application, hardening and sintering processes, so that it is polymerized to function as an insulating film while securing adhesion between the light emitting part and the temporary substrate 111. In this case, when the adhesive part 110 is thick, the adhesive part 110 itself may function as the temporary substrate. Accordingly, the temporary substrate may not be required to be attached thereto.

Figure 10:
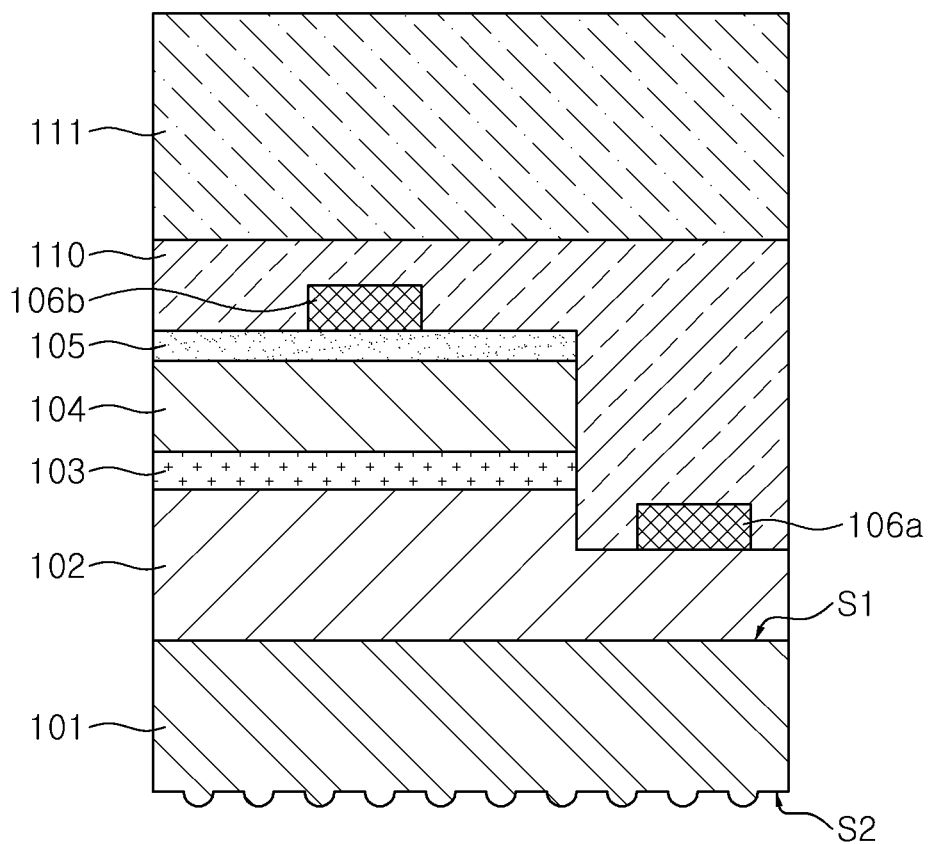
Figure 11:
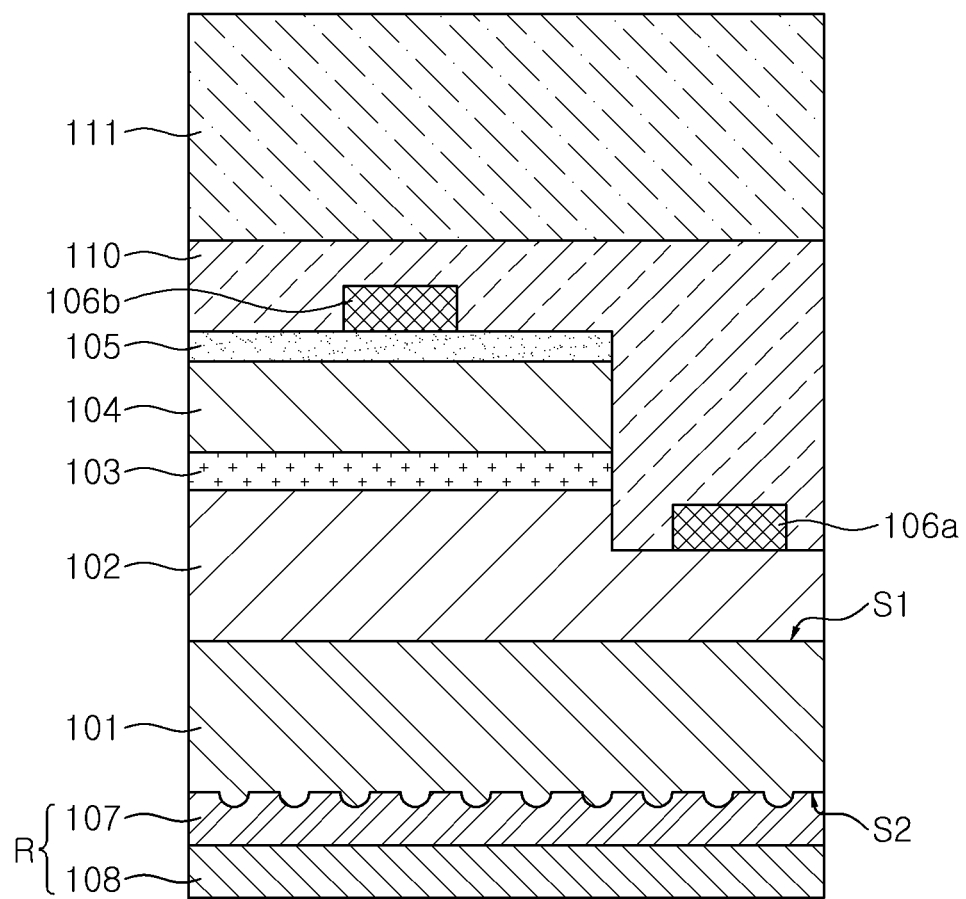

Then, as shown in FIG. 10, in a state in which the temporary substrate 111 is attached to the light emitting part, an uneven portion may be formed on the second main surface S2 of the light transmissive substrate 101. As an example of a method of forming the uneven portion, an anisotropic etching mask is applied to the second main surface S2 and an etching process such as inductively coupled plasma reactive ion etching (ICP-RIE) is performed thereon. Instead of such an etching process, a wet etching process may be used to form the uneven portion. Then, as shown in FIG. 11, the light transmissive dielectric layer 107 and the reflective metallic layer 108 may be sequentially formed on the second main surface S2 of the light transmissive substrate 101 using an appropriate deposition process, thereby forming the rear reflective part R. In this case, as described above, the light transmissive dielectric layer 107 may have a DBR structure, and the rear reflective part R may have an ODR structure. To enable this, the light transmissive dielectric layer 107 may have a thickness satisfying $\lambda/4n$ of a wavelength of light emitted from the active layer 103; however, this condition is not necessarily required. The thickness of the light transmissive dielectric layer 107 may be altered within a range allowing for desired reflective performance. Although not shown, after the rear reflective part R is formed as described above, the temporary substrate 111 and the adhesive part 110 are separated from the light emitting part to thereby obtain the light emitting structure as shown in FIG. 1.

Figure 12:
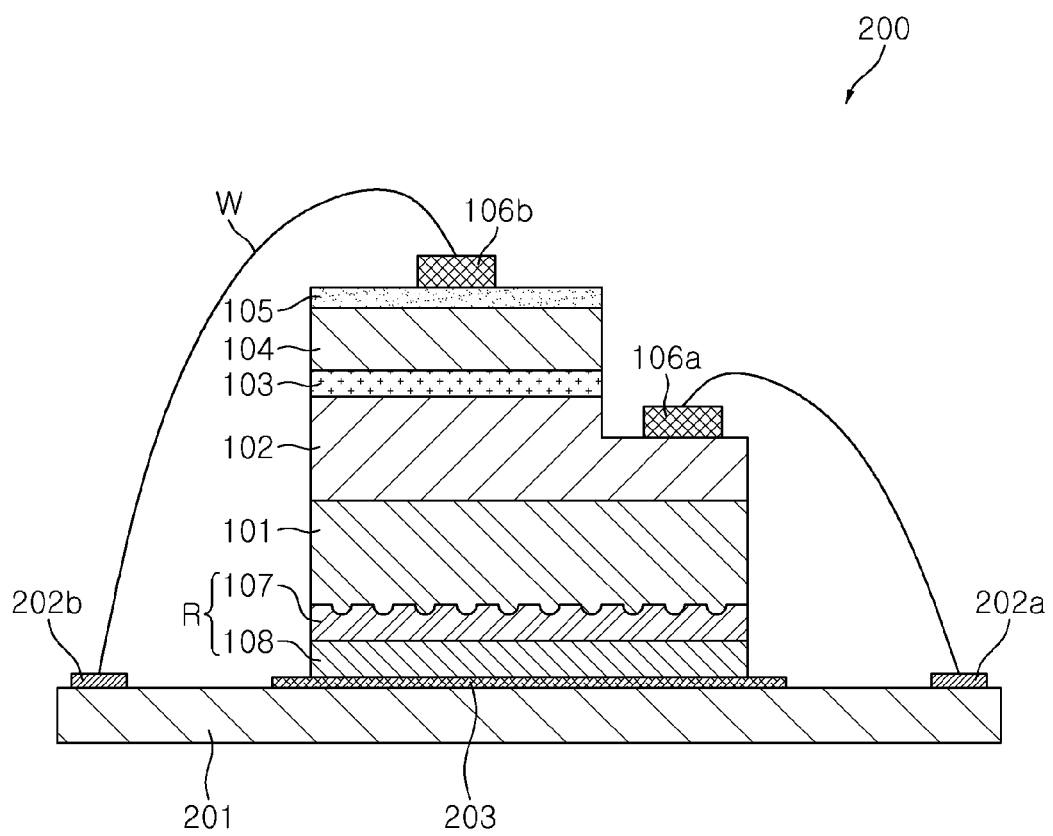
FIG. 12 is a schematic cross-sectional view illustrating a light emitting apparatus according to another embodiment of the present invention.

The semiconductor light emitting device having the above-described structure may be mounted on a mounting substrate or the like, thereby being used as a light emitting apparatus such as a backlight unit used for a display device, an indoor/outdoor illumination device, a headlight, or the like. FIG. 12 is a schematic cross-sectional view illustrating a light emitting apparatus according to another embodiment of the present invention. A light emitting apparatus 200 according to this embodiment includes a semiconductor light emitting device mounted on a mounting substrate 201. Here, the semiconductor light emitting device may have the structure of FIG. 1. An adhesive layer 203 may be interposed between the semiconductor light emitting device and the mounting substrate 201. In consideration of dissipation of heat, the adhesive layer 203 may be formed of a eutectic alloy such as AuSn, a polymer such as a silicon resin, or the like. The mounting substrate 201 may be provided as a circuit board such as a PCB, an MCPCB, an FPCB, an MPCB or the like. In this case, circuit patterns 202a and 202b may be connected to the first and second electrodes 106a and 106b using a conductive wire W. Instead of the conductive wire W, a wiring structure in the form of a conductive line may be formed along the mounting substrate 201 and the surface of the light emitting part.

Meanwhile, the mounting substrate 201 may be provided as the circuit board as described above; however, the mounting substrate 201 may be provided as at least one pair of lead frames in a package level. In this case, the circuit patterns 202a and 202b may not be provided.

As set forth above, according to embodiments of the invention, a semiconductor light emitting device includes a reflector structure on a rear surface of a growth substrate, the reflector structure having superior light reflectance and heat dissipation characteristics.

In addition, there is provided a method of manufacturing the above semiconductor light emitting device in an efficient manner.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device comprising:
   a light transmissive substrate having first and second main surfaces facing each other, the second main surface having an uneven portion formed thereon;
   a light emitting part disposed on the first main surface, and including first and second conductivity type semiconductor layers and an active layer interposed therebetween;
   first and second electrodes electrically connected to the first and second conductivity type semiconductor layers, respectively; and
   a rear reflective part including a reflective metallic layer disposed on the second main surface, and a light transmissive dielectric layer interposed between the light transmissive substrate and the reflective metallic layer,
   wherein the light transmissive dielectric layer and the reflective metallic layer form an omni-directional reflector (ODR) structure disposed on the second main surface,
   wherein a substantial portion of an entire surface between the reflective metallic layer and the light transmissive dielectric layer is uneven.

2. The semiconductor light emitting device of claim 1, wherein the light transmissive dielectric layer includes a plurality of dielectric layers having different refractive indexes and alternately stacked.

3. The semiconductor light emitting device of claim 2, wherein the plurality of dielectric layers have a distributed Bragg reflector (DBR) structure.

4. The semiconductor light emitting device of claim 1, wherein the light transmissive substrate includes an uneven portion formed on the first main surface thereof.

5. The semiconductor light emitting device of claim 1, wherein the reflective metallic layer is formed of a material selected from the group consisting of aluminum (Al), silver (Ag), nickel (Ni), rhodium (Rh), palladium (Pd), iridium (Ir), ruthenium (Ru), magnesium (Mg), zinc (Zn), platinum (Pt), and gold (Au).

6. The semiconductor light emitting device of claim 1, further comprising a planarization layer filling an uneven surface of the reflective metallic layer when surfaces of the light transmissive dielectric layer and the reflective metallic layer are unevenly formed due to conforming to curves of the uneven portion formed on the light transmissive substrate.

7. The semiconductor light emitting device of claim 6, wherein the planarization layer is formed of spin on glass (SOG).

8. The semiconductor light emitting device of claim 1, wherein the light transmissive dielectric layer is formed of a material having a thermal conductivity higher than that of the light transmissive substrate.

9. The semiconductor light emitting device of claim 1, further comprising a planarization layer formed on the reflective metallic layer.

10. The semiconductor light emitting device of claim 9, wherein a surface interface between the reflective metallic layer and the planarization layer has an uneven portion.

11. The semiconductor light emitting device of claim 9, wherein a substantial portion of an entire surface interface between the reflective metallic layer and the planarization layer is uneven.

* * * * *